(12) United States Patent
Lu

(10) Patent No.: US 10,212,006 B2
(45) Date of Patent: Feb. 19, 2019

(54) FEED-FORWARD FILTERING DEVICE AND ASSOCIATED METHOD

(71) Applicant: MEDIATEK INC., Hsin-Chu (TW)

(72) Inventor: Tai-You Lu, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/424,892

(22) Filed: Feb. 6, 2017

(65) Prior Publication Data

US 2017/0257235 A1    Sep. 7, 2017

Related U.S. Application Data

(60) Provisional application No. 62/301,631, filed on Mar. 1, 2016.

(51) Int. Cl.
| | |
|---|---|
| H04L 25/03 | (2006.01) |
| H04L 12/873 | (2013.01) |
| H03H 1/02 | (2006.01) |
| H03H 11/12 | (2006.01) |
| H03H 21/00 | (2006.01) |
| H03H 11/04 | (2006.01) |

(52) U.S. Cl.
CPC ......... *H04L 25/03993* (2013.01); *H03H 1/02* (2013.01); *H03H 11/0461* (2013.01); *H03H 11/1213* (2013.01); *H03H 21/00* (2013.01); *H04L 25/03847* (2013.01); *H04L 47/522* (2013.01); *G10K 2210/108* (2013.01); *H03H 11/1269* (2013.01); *H04L 25/03057* (2013.01)

(58) Field of Classification Search
CPC ......... H04L 25/03993; H04L 25/03847; H04L 47/522; H04L 25/03057; H03H 1/02; H03H 11/1213; H03H 21/00; H03H 11/1269; G10K 2210/108

See application file for complete search history.

(56) References Cited

U.S. PATENT DOCUMENTS

| | | | |
|---|---|---|---|
| 4,078,215 A | 3/1978 | Vinson | |
| 5,345,476 A * | 9/1994 | Tsujimoto | H04B 1/123 333/18 |
| 6,400,761 B1 * | 6/2002 | Smee | H04L 25/03057 375/232 |
| 8,767,811 B2 * | 7/2014 | Zhong | H04L 25/03343 375/219 |
| 9,148,183 B2 | 9/2015 | Alzaher | |
| 9,954,497 B2 | 4/2018 | Zhu | |
| 2005/0266820 A1 | 12/2005 | Behzad | |
| 2009/0066446 A1 | 3/2009 | Sahu | |
| 2010/0022215 A1 | 1/2010 | Ganger | |

(Continued)

FOREIGN PATENT DOCUMENTS

KR    2003-0048046 A    6/2003

*Primary Examiner* — Janice N Tieu
(74) *Attorney, Agent, or Firm* — Winston Hsu

(57) ABSTRACT

A filtering device includes a low-pass filter (LPF), a noise estimation circuit and a first combining circuit. The LPF receives and filters a pre-filtering signal to generate an output signal of the filtering device. The noise estimation circuit estimates an estimated noise signal according to the output signal and the pre-filtering signal. The first combining circuit subtracts the estimated noise signal from an input signal of the filtering device to generate the pre-filtering signal.

9 Claims, 7 Drawing Sheets

(56) References Cited

U.S. PATENT DOCUMENTS

| | | | |
|---|---|---|---|
| 2010/0061649 A1* | 3/2010 | Hou | H04N 19/176 |
| | | | 382/263 |
| 2011/0012692 A1 | 1/2011 | Mirzaei | |
| 2012/0319767 A1 | 12/2012 | Ao leong | |
| 2013/0021183 A1 | 1/2013 | Ashburn, Jr. | |

* cited by examiner

FEED-FORWARD FILTERING DEVICE AND ASSOCIATED METHOD

CROSS REFERENCE TO RELATED APPLICATIONS

This application claims the benefit of U.S. Provisional Application No. 62/301,631, filed on Mar. 1, 2016 and incorporated herein by reference.

BACKGROUND

In an integrated circuit (IC) design, circuitry comprising hundreds of circuit blocks has to be designed within a limited area. A Resistor-Capacitor (RC) low-pass filter is the most common filter used for filtering out undesired noise, but resistors cost a larger area in more advanced IC technology. Therefore, a filtering technique which can reduce the area of the filter for an RC based filter while also being able to effectively filter out undesired noise is required.

SUMMARY

One of the objectives of the present invention is to provide a filtering device and an associated filtering method to solve the abovementioned problems.

According to a first aspect of the present invention, a filtering device is disclosed, wherein the filtering device comprises a low pass-filter (LPF), a noise estimation circuit, and a first combining circuit. The low pass-filter is arranged to receive and filter a pre-filtering signal to generate an output signal of the filtering device; the noise estimation circuit is arranged to estimate an estimated noise signal according to the output signal and the pre-filtering signal; and a first combining circuit is arranged to subtract the estimated noise signal from an input signal of the filtering device to generate the pre-filtering signal.

According to a second aspect of the present invention, a filtering device is disclosed, comprising a low-pass filter (LPF), a feedback circuit and a resistor circuit. The low-pass filter is arranged to receive and filter a pre-filtering signal from an interconnection node to generate an output signal of the filtering device; the feedback circuit is arranged to receive the output signal to generate a feedback signal; and the resistor circuit is coupled between an input signal of the filtering device and the feedback signal to generate the pre-filtering signal at the interconnection node; wherein the input signal, the pre-filtering signal and the output signal are voltage signals.

According to a third aspect of the present invention, a filtering method is disclosed, wherein the filtering method comprises: performing a low-pass filtering (LPF) operation upon a pre-filtering signal to generate an output signal; estimating a estimated noise signal according to the output signal and the pre-filtering signal; and subtracting the estimated noise signal from an input signal to generate the pre-filtering signal.

According to a fourth aspect of the present invention, a filtering method is disclosed, wherein the filtering method comprises: performing a low-pass filtering (LPF) operation upon a pre-filtering signal from an interconnection node to generate an output signal; generating a feedback signal according to the output signal; and utilizing a resistor circuit coupled between an input signal and the feedback signal to generate the pre-filtering signal at the interconnection node; wherein the input signal, the pre-filtering signal and the output signal are voltage signals.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

Figure 1:
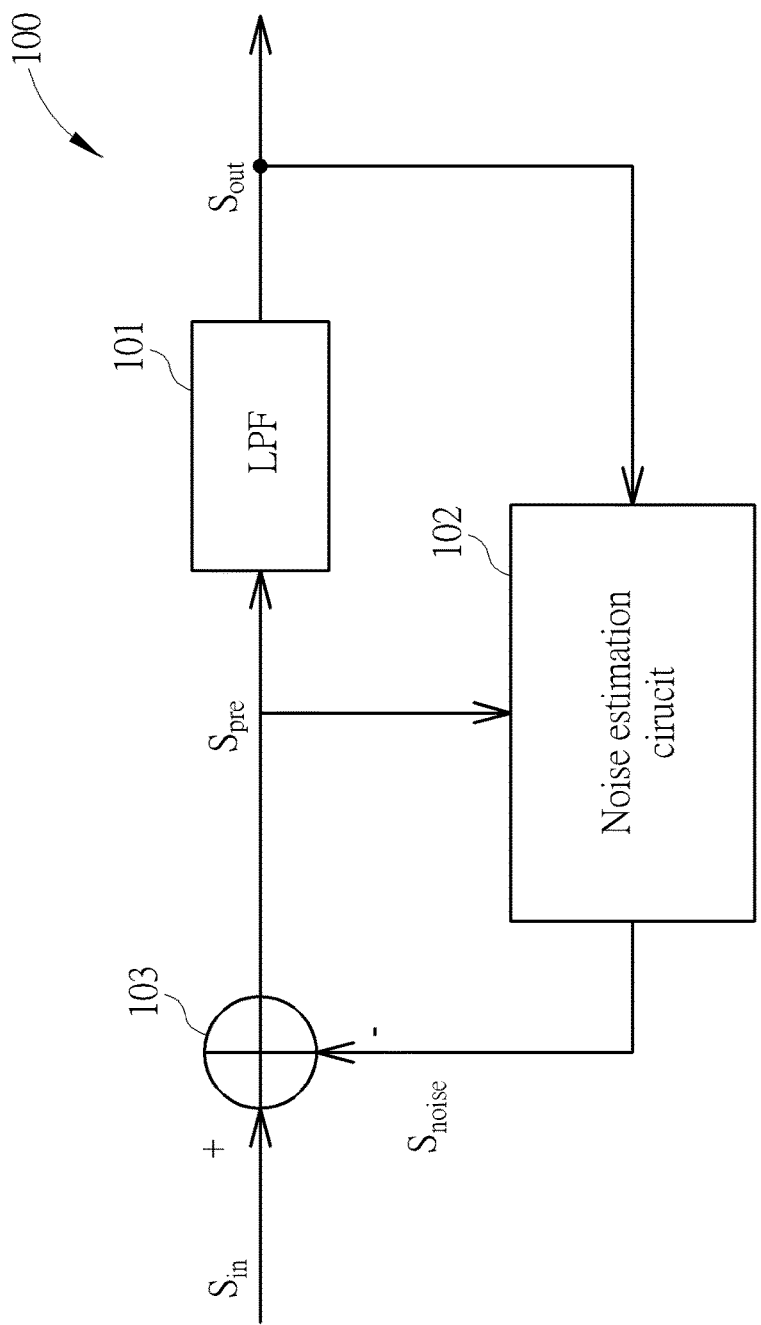
FIG. 1 is a diagram illustrating a filtering device according to an embodiment of the present invention.

FIG. 1 is a diagram illustrating a filtering device 100 according to an embodiment of the present invention. The filtering device 100 may be a feed-forward filtering device. As shown in FIG. 1, the filtering device 100 comprises a low-pass filter (LPF) 101, a noise estimation circuit 102 and a combining circuit 103, wherein the low-pass filter 101 receives and filters a pre-filtering signal $S_{pre}$ to generate an output signal $S_{out}$, the noise estimation circuit 102 generates an estimated noise signal $S_{noise}$ according to the output signal $S_{out}$ and the pre-filtering signal $S_{pre}$, and the combining circuit 103 subtracts the estimated noise signal $S_{noise}$ from an input signal $S_{in}$ to generate the pre-filtering signal $S_{pre}$. It should be noted that the pre-filtering signal $S_{pre}$, the output signal $S_{out}$ and the input signal $S_{in}$ illustrated here can be referred to as voltage signals (e.g. $V_{pre}$, $V_{out}$, and $V_{in}$) or current signals (e.g. $I_{pre}$, $I_{out}$, and $I_{in}$). The noise can be greatly reduced by subtracting the estimated noise signal $S_{noise}$ generated by the noise estimation circuit 102 from the input signal $S_{in}$ when the input signal $S_{in}$ enters the circuit.

Figure 2:
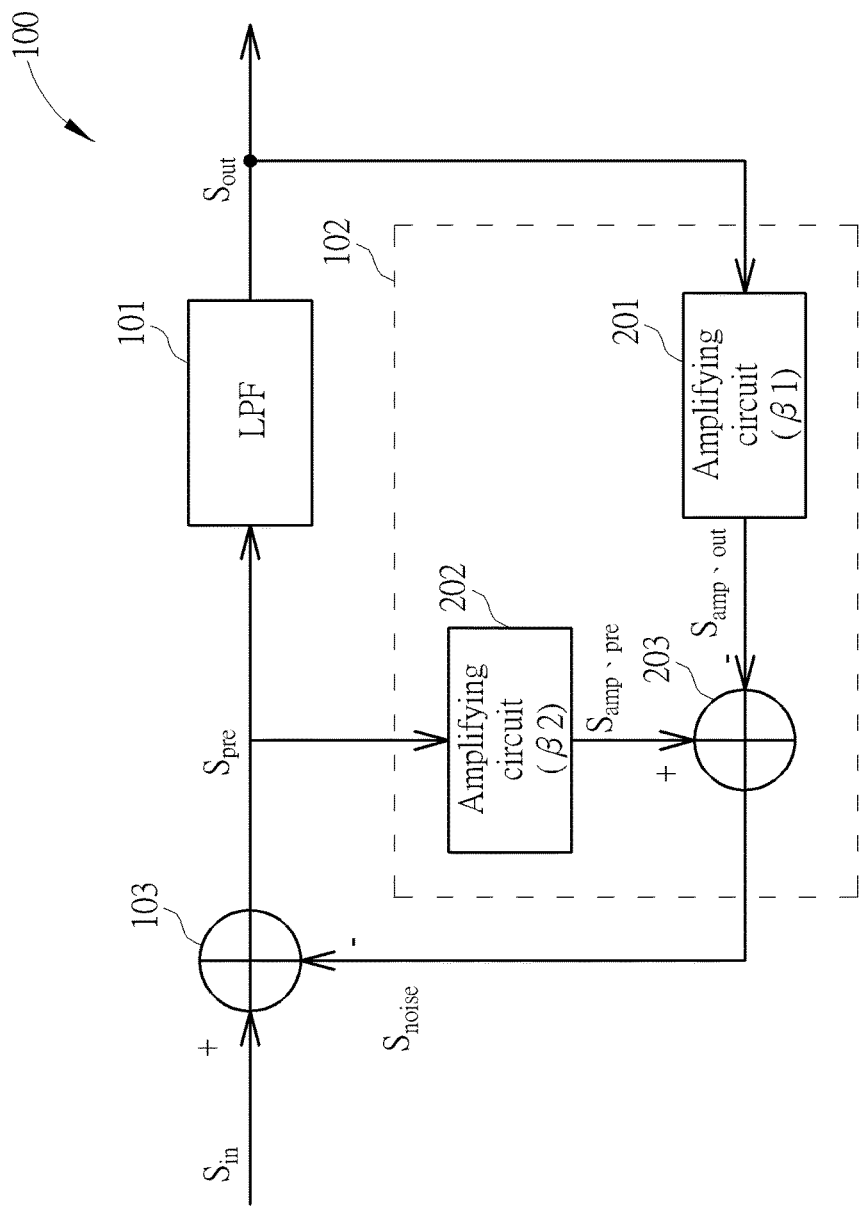
FIG. 2 is a diagram illustrating a noise estimation circuit of the filtering device of FIG. 1 according to an embodiment of the present invention.

FIG. 2 is a diagram illustrating the noise estimation circuit 102 of the filtering device 100. As shown in FIG. 2, the noise estimation circuit 102 may be implemented using amplifying circuits 201 and 202, and a combining circuit 203. The gain of the amplifying circuit 201 is β1, while the gain of the amplifying circuit 202 is β2. The amplifying circuit 201 is arranged to amplify the output signal $S_{out}$ to generate an amplified output signal $S_{amp.out}$, where $S_{amp.out}=\beta 1 \cdot S_{out}$. The amplifying circuit 202 is arranged to amplify the pre-filtering signal $S_{pre}$ to generate an amplified pre-filtering signal $S_{amp.pre}$, where $S_{amp.pre}=\beta 2 \cdot S_{pre}$. The combining circuit 203 subtracts the amplified output signal $S_{amp.out}$ from the amplified pre-filtering signal $S_{amp.pre}$ to generate the estimated noise signal $S_{noise}$ as shown in FIG. 2. It should be noted that the configuration of the noise estimation circuit 102 shown in FIG. 2 is for illustrative purposes only. In one embodiment, both the amplifying circuits 201 and 202 can be replaced with a unity-gain buffer. In another embodiment, the amplifying circuits 201 and 202 can be optional. For example, only the amplifying circuit 201 is used and the pre-filtering signal $S_{pre}$ is directly fed into the combining circuit 203, and the combining circuit 203 subtracts the amplified output signal $S_{amp.out}$ from the pre-filtering signal $S_{pre}$, where the pre-filtering signal $S_{pre}$ is received by the combining circuit 203. For another example, only the amplifying circuits 202 is used and the output signal $S_{out}$ is directly fed into the combining circuit 203, and the combining circuit 203 can subtract the output signal $S_{out}$ from the amplified pre-filtering signal $S_{amp.pre}$, where the output signal $S_{out}$ is received by the combining circuit 203. For a further example, neither the amplifying circuit 201 nor the amplifying circuit 202 is used. The combining circuit 203 subtractS the output signal $S_{out}$ from the pre-filtering signal $S_{pre}$, where the output signal $S_{out}$ and the pre-filtering signal $S_{pre}$ are received by the combining circuit 203.

After subtracting the output signal $S_{out}$ (or the amplified output signal $S_{amp.out}$) which is filtered by the low-pass filter 101 from the pre-filtering signal $S_{pre}$ (or the amplified pre-filtering signal $S_{amp.pre}$) which has not been filtered, the estimated noise signal $S_{noise}$ can be extracted.

Figure 3:
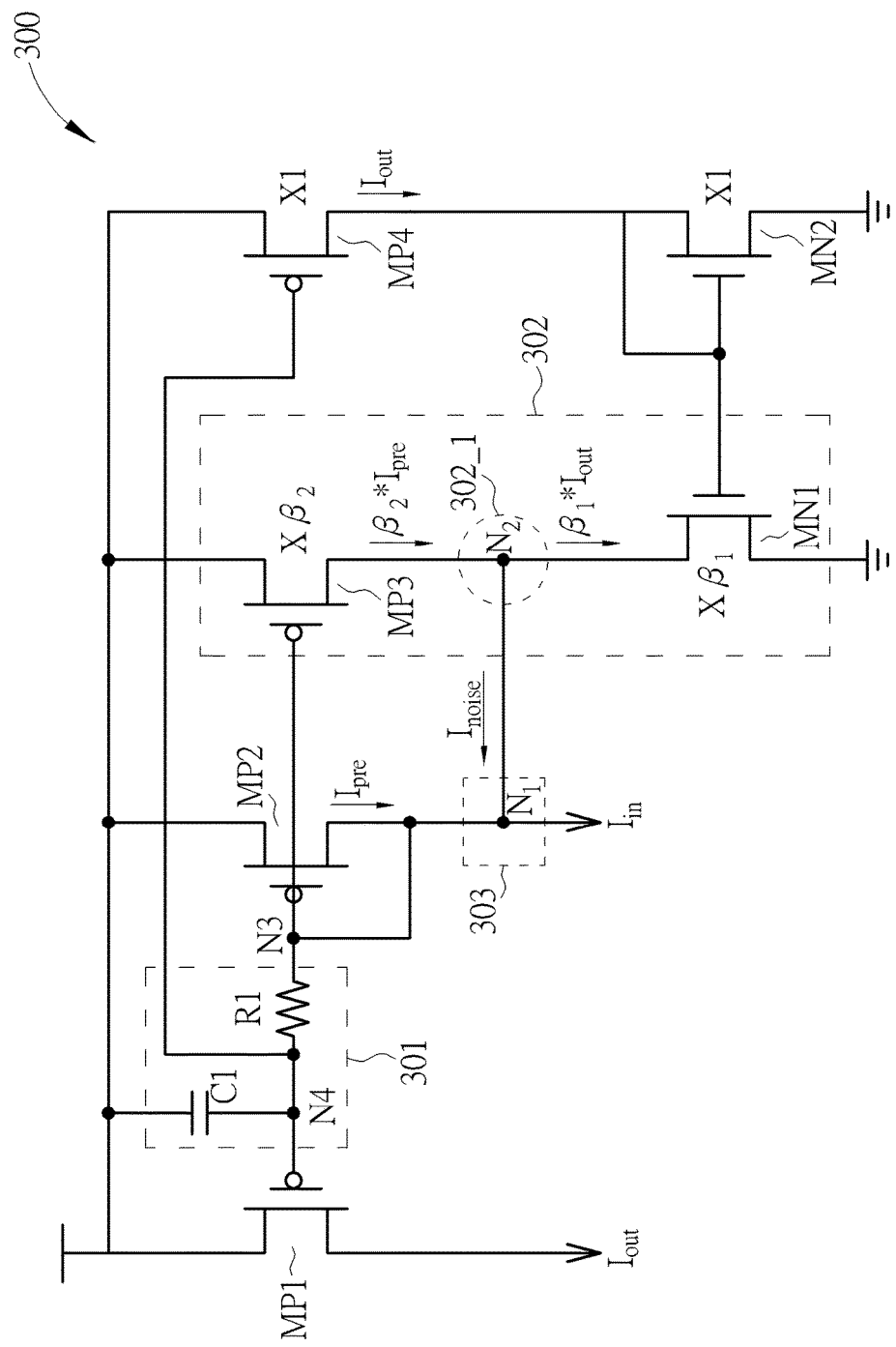
FIG. 3 is a circuit diagram of a filtering device implemented according to the filtering devices shown in FIG. 1 and FIG. 2.

FIG. 3 is a circuit diagram of a filtering device 300 implemented according to the filtering devices shown in FIG. 1 and FIG. 2. In the embodiment of FIG. 3, the pre-filtering signal $S_{pre}$, the output signal $S_{out}$, the estimated noise signal $S_{noise}$ and the input signal $S_{in}$ are referred to as current signals, i.e. an pre-filtering signal $I_{pre}$, an output signal $I_{out}$, an estimated noise signal $I_{noise}$ and an input signal $I_{in}$ as marked in FIG. 3. As shown in FIG. 3, the filtering device 300 is composed of a plurality of current mirrors including transistors MP1, MP2, MP3, MP4, MN1 and MN2, where MP1, MP2, MP3 and MP4 are P-channel metal oxide semiconductor (PMOS) transistors, and MN1 and MN2 are N-channel metal oxide semiconductor (NMOS) transistors. The filtering device 300 comprises a low-pass filter 301, a noise estimation circuit 302 and a combining circuit 303, wherein the low-pass filter 301 is a passive Resistor-Capacitor filter composed of a resistor R1 and a capacitor C1, the noise estimation circuit 302 is composed of the transistor MP3, the transistor MN1 and a combining circuit 302_1 implemented by a node N2 for draining and receiving current, and the combining circuit 303 is implemented by a node N1 in this embodiment. As mentioned in the embodiment of FIG. 2, the transistor MP3 included in the noise estimation circuit 302 is referred to as the amplifying circuit 202 for amplifying a current signal $I_{pre}$ generated by the transistor MP2 according to its channel width or length. The channel width of the transistor MP3 may be configured to be $\beta 2$ times as large as the channel width of the transistor MP2. In this way, the current generated by the transistor MP3 is $\beta 2^*I_{pre}$ when the current generated by the transistor MP2 is $I_{pre}$. The low-pass filter 301 is coupled between the transistor MP1 and MP2. The pre-filtering signal $I_{pre}$ is received by the low-pass filter 301 via a node N3. The low-pass filter 301 filters the pre-filtering signal $I_{pre}$ to generate a filtered signal at a node N4. The transistor MP1 receives the filtered signal to generate the output signal $I_{out}$. With the function of a current mirror, the transistor MP4 replicates the current of the output signal $I_{out}$ and also produces the output signal $I_{out}$. The output signal $I_{out}$ flows via the drain terminals of the transistor MP4 and MN2, where in one embodiment, the channel width of the transistor MP4 is same as that of the transistor MP1 to mirror the current signal $I_{out}$ directly on the drain terminal of the transistor MP4. By configuring the channel width of the transistor MN1 to be $\beta 1$ times as large as that of the transistor MN2, i.e. when the channel width of the transistor MN2 is marked as 1, the channel width of the transistor MN1 is marked as $\beta 1$, a current $\beta 1^*I_{out}$ is generated from a drain terminal of the transistor MN1. Please note that the channel width of the transistor MP4 and that of the transistor MN2, as well as the gain provided by the transistor MP4 and the gain provided by the transistor MN2, should be subject to circuit designs and thus can be varying accordingly. In accordance with the Kirchhoff Circuit Laws, an estimated noise signal $I_{noise}$ is drained from the node N2 included in the combining circuit 203_1 to the node N1 included in the combining circuit 303, and a current signal $I_{in}$ is thus drained from the node N1 according to the estimated noise signal $I_{noise}$ and the pre-filtering $I_{pre}$.

The following current equations which illustrate the Kirchhoff Circuit Laws can explain the embodiment of FIG. 3 clearly.

$$Iin(s)-Inoise(s)=Ipre(s) \quad (1)$$

$$Inoise(s)=\beta 2^*Ipre(s)-\beta 1^*Iout(s) \quad (2)$$

$$Iout(s)=H(s)^*Ipre(s) \quad (3)$$

wherein H(s) is the transfer function of the low-pass filter 301.

According to the equations (1)-(3) illustrated above, the relation between the output signal $I_{out}$ and the input signal $I_{in}$ can be written as follows:

$$\frac{Iout(s)}{Iin(s)} = \frac{1}{(1+\Delta\beta)+\dfrac{s}{\dfrac{\omega p}{1+\beta 2}}} \quad (4)$$

wherein $\Delta\beta=\beta 2-\beta 1$. According to equation (4), the −3 dB frequency $\omega_{-3dB}$ of the filtering device 300 is:

$$\omega_{-3dB} = \frac{1+\Delta\beta}{1+\beta 2}\omega_p \quad (5)$$

According to equation (5), the −3 dB frequency of the filtering device 300 can be reduced by $1+\beta 2$ when $\beta 1=\beta 2$, which can decrease the noise effectively. It should be noted that, in this embodiment, $\Delta\beta$ must be greater than −1, or a positive feedback might occur in the filtering device 300.

Figure 4:
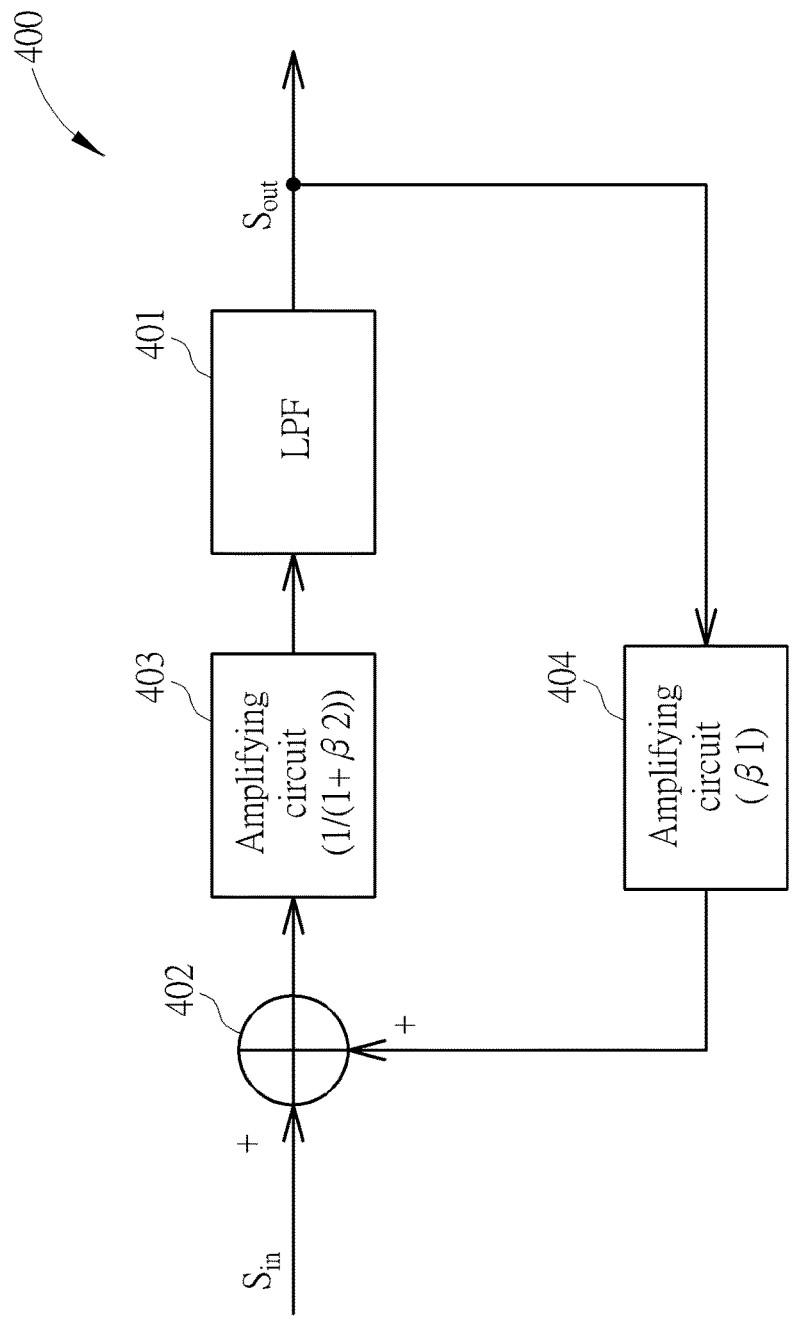
FIG. 4 is a diagram illustrating a simplified circuit of the filtering device shown in FIG. 2.

FIG. 4 is a diagram illustrating a filtering device 400, which is a simplified circuit of that shown in FIG. 2. Referring to FIG. 2 again, by combining the combining circuits 103 and 203, the filtering device 100 can be simplified accordingly. As shown in FIG. 4, the filtering device 400 comprises a low-pass filter (LPF) 401, a combining circuit 402, and amplifying circuits 403 and 404, wherein the gain of the amplifying circuit 403 is $1/(1+\beta 2)$, while the gain of the amplifying circuit 404 is β1. Based on the same theory, the filtering device 300 can be thus simplified by combining the combining circuits 303 and 302_1 shown in FIG. 3.

Figure 5:
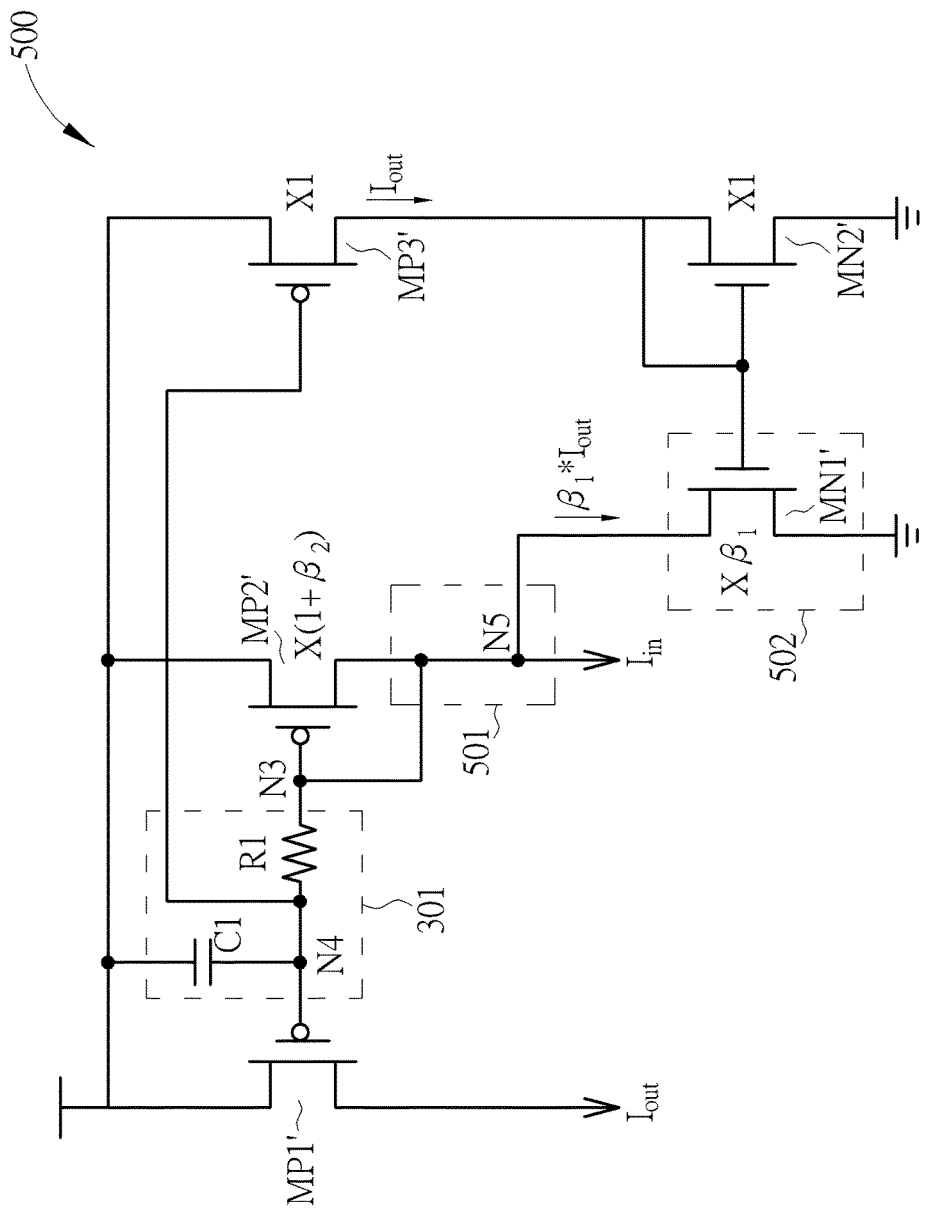
FIG. 5 is a diagram illustrating a simplified circuit of the filtering device shown in FIG. 3.

FIG. 5 is a diagram illustrating a filtering device 500, which is a simplified circuit of that shown in FIG. 3. As shown in FIG. 5, the filtering device 500 is composed of a plurality of current mirrors including transistors MP1', MP2', MP3', MN1' and MN2', where MP1', MP2' and MP3' are PMOS transistors, and MN1' and MN2' are NMOS transistors. The difference between the embodiments of FIG. 3 and FIG. 5 is that the two transistors MP2 and MP3 shown in FIG. 3 are combined as a single transistor MP2' based on the concept of combining two circuits as shown in FIG. 4. After combining the transistor MP2 and MP3 as the transistor MP2', the filtering device 500 thus comprises a combining circuit 501 implemented by a node N5 whose function is similar/identical with the combining circuit 401 for combining the current $I_{in}$ and $\beta1*I_{out}$. The filtering device comprises a amplifying circuit 502 implemented by the transistor MN1' whose function is similar/identical with the amplifying circuit 404 for amplifying the output current $I_{out}$ by β1. As descried in the embodiment of FIG. 3, the low-pass filter 301 generates a filtered signal at the node N4. The transistor MP1' receives the filtered signal to generate the output signal $I_{out}$. With the function of a current mirror, the transistor MP3' replicates the current of the output signal $I_{out}$ and also produces the output signal $I_{out}$. The output signal $I_{out}$ flows via the drain terminals of the transistors MP3' and MN2'. Those skilled in the art should readily understand the detailed operation of the circuit shown in FIG. 5 after reading the above paragraphs. A detailed description is therefore omitted here for brevity.

The embodiments of FIG. 3 and FIG. 5 are implemented by a plurality of current mirrors; however, both implementations are hard to be applied to filtering voltage signals. In practice, a condition β1=β2 is used to simplify the filtering device 400 for the situation where the input signals $S_{in}$, the pre-filtering signal $S_{pre}$ and the output signal $S_{out}$ are voltage signals instead of current signals.

Figure 6:
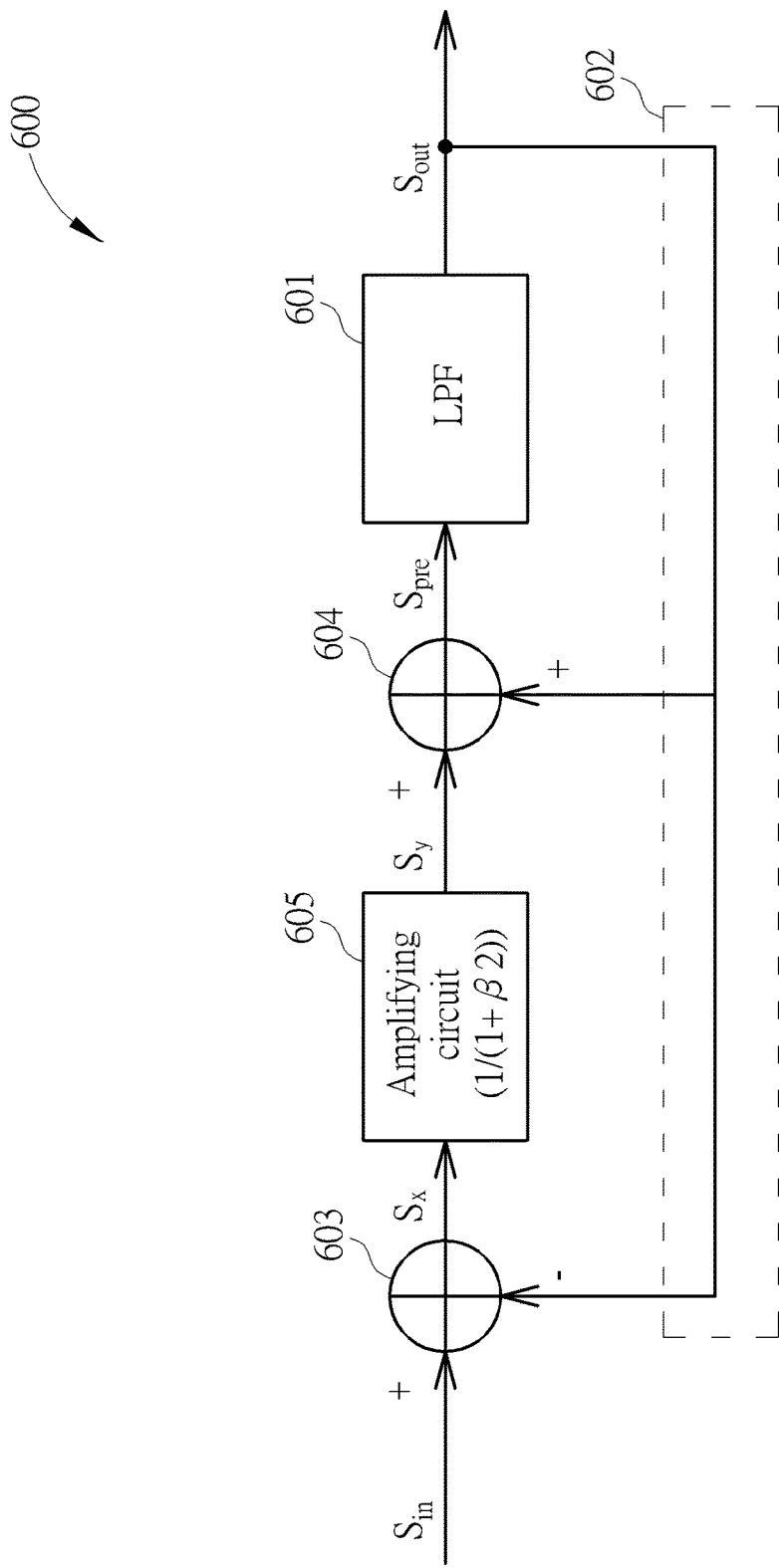
FIG. 6 is a diagram illustrating a simplified circuit of the filtering device shown in FIG. 4.

Under the condition β1=β2, the filtering device 400 shown in FIG. 4 can be simplified to the circuit 600 shown in FIG. 6. The filtering device 600 comprises a low-pass filter (LPF) 601, a feedback path 602, combining circuits 603 and 604, and an amplifying circuit 605, wherein the low-pass filter 601 is arranged to receive and filter the pre-filtering $S_{pre}$ to generate the output signal $S_{out}$ which is sent to the combining circuits 603 and 604 through the feedback path 602. The combining circuit 603 is arranged to subtract the output signal $S_{out}$ from the input signal $S_{in}$ to generate a signal $S_x$. The amplifying circuit 605 is arranged to amplify the signal $S_x$ to generate a signal $S_y$, and the combining circuit 604 is arranged to combine the signal $S_y$ and the output signal $S_{out}$ to generate the pre-filtering signal $S_{pre}$. It should be noted that the input signal $S_{in}$, the signals $S_x$ and $S_y$, the pre-filtering signal $S_{pre}$ and the output signal $S_{out}$ are referred to as voltage signals in this embodiment. The following equation (6) describes the relation between the pre-filtering signal $S_{pre}$ and the output signal $S_{out}$ according to the embodiment in FIG. 6.

$$Spre = Sout * \left(\frac{-1}{\beta2+1} + 1\right) \quad (6)$$

Figure 7:
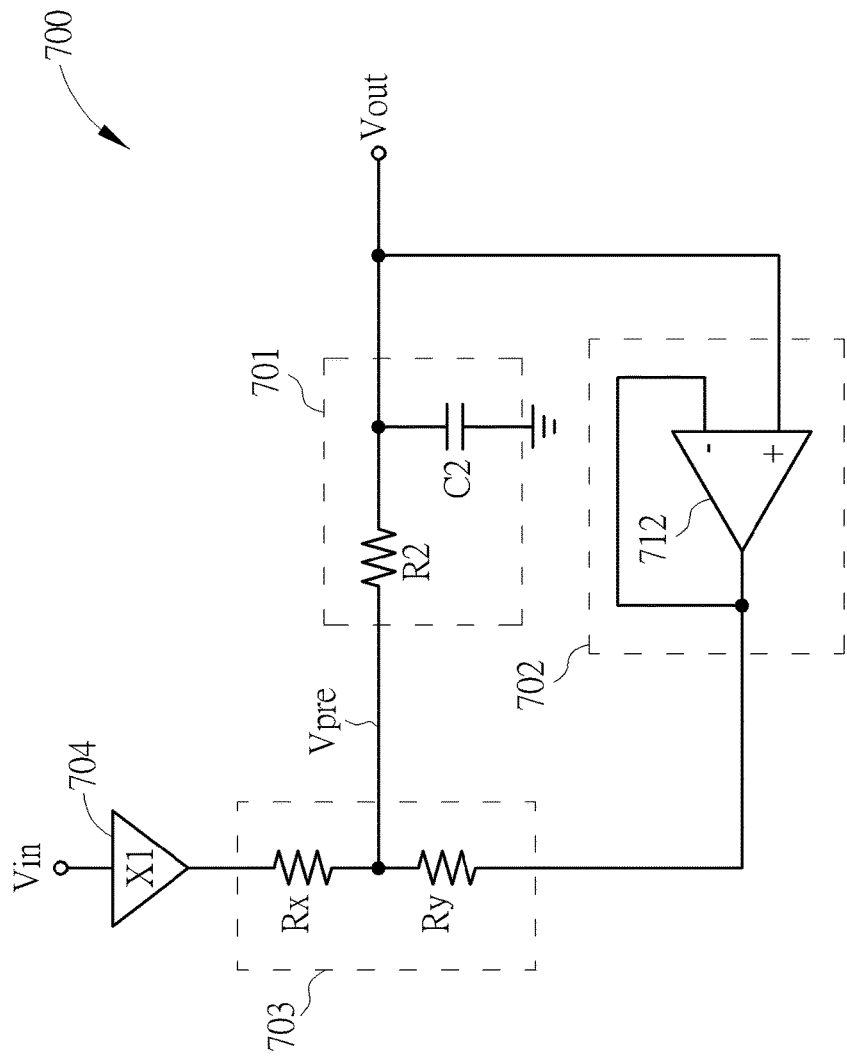
FIG. 7 is a diagram illustrating a filtering device implemented according to the filtering device shown in FIG. 6.

According to equation (6), a filtering device arranged for filtering voltage signals, instead of current signals, can be easily implemented. FIG. 7 is a diagram illustrating a filtering device 700 implemented according to the filtering device shown in FIG. 6. In the embodiment of FIG. 7, the pre-filtering signal $S_{pre}$, the output signal $S_{out}$, and the input signal $S_{in}$ are referred to as voltage signals, i.e. the pre-filtering signal $V_{pre}$, the output signal $V_{out}$, and the input signal $V_{in}$ as marked in FIG. 7. The filtering device 700 comprises a low-pass filter 701, a feedback circuit 702 and a resistor circuit 703, wherein the low-pass filter 701 is a passive Resistor-Capacitor filter including a resistor R2 and a capacitor C2, the feedback circuit 702 comprises a feedback buffer 712, and the resistor circuit 703 comprises a plurality of resistors Rx and Ry. More specifically, the low-pass filter 701 is arranged to receive and filter the pre-filtering signal $V_{pre}$ to generate an output signal $V_{out}$. The feedback buffer 712 included in the feedback circuit 702 is arranged to send the output signal $V_{out}$ to the resistor circuit 703. The resistors Rx and Ry are connected in series and coupled between the output signal $V_{out}$ and an input signal $V_{in}$ is arranged to serve as a voltage divider that divides the voltage to generate the pre-filtering signal $V_{pre}$ shown in FIG. 7. The following equations describe the relation between the input signal $V_{in}$ and the output signal $V_{out}$ according to the embodiment in FIG. 7.

$$\left[(Vin(s) - Vout(s)) * \frac{Ry}{Rx + Ry} + Vout(s)\right] * H(s) = Vout(s) \quad (7)$$

$$H(s) = \frac{1}{1 + \frac{s}{\omega_p}} \quad (8)$$

wherein H(s) is the transfer function of the low-pass filter 701.

According to equations (7) and (8), it can be deduced that $$\frac{Vout(s)}{Vin(s)} = \frac{1}{1 + \frac{s}{\frac{\omega_p}{1+\beta2}}}, \quad (9)$$

$$\beta2 = \frac{Rx}{Ry}$$

Based on equation (9), the −3 dB frequency of the filtering device 700 can be reduced by 1/(1+β2) to decrease the noise effectively.

In practice, the input signal $V_{in}$ might not have enough driving ability; the filtering device 700 can therefore be configured to further comprise a buffer 704 coupled between the input signal $V_{in}$ and the resistor Rx, which increases the driving ability of input signal $V_{in}$, as shown in FIG. 7.

It should be noted that, in the embodiments of FIG. 3, FIG. 5 and FIG. 7, the low-pass filters 301, 501, and 701 are implemented by passive Resistor-Capacitor filters. This is only for illustrative purposes and not a limitation of the present invention. In other embodiments, the low-pass filter can be implemented by other circuits such as an active low-pass filter.

Briefly summarized, embodiments of the present invention disclose filtering devices employing the feed forward technique to subtract noise from the input signal when the input signal enters the circuit. In this way, noise can be effectively decreased without increasing the resistance of a resistor included in a low-pass filter, and the consumed area for a low-pass filter in an integrated circuit can also be effectively limited.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A filtering device, comprising:
   a low-pass filter (LPF), arranged to receive and filter a pre-filtering signal to generate an output signal of the filtering device;
   a noise estimation circuit, arranged to generate an estimated noise signal according to the output signal and the pre-filtering signal; and
   a first combining circuit, arranged to subtract the estimated noise signal from an input signal of the filtering device to generate the pre-filtering signal;
   wherein the noise estimation circuit comprises:
      a first amplifying circuit, arranged to amplify the output signal by a first gain to generate an amplified output signal;
      a second amplifying circuit, arranged to amplify the pre-filtering signal by a second gain to generate an amplified pre-filtering signal; and
      a second combining circuit, arranged to subtract the amplified output signal from the amplified pre-filtering signal to generate the estimated noise signal.

2. The filtering device of claim 1, wherein the second gain minus the first gain is greater than minus one.

3. The filtering device of claim 1, wherein the input signal, the pre-filtering signal and the output signal are current signals.

4. The filtering device of claim 3, wherein the first combining circuit comprises:
   an interconnection node, arranged to receive the estimated noise signal and the pre-filtering signal, wherein the input signal is drained from the interconnection node.

5. The filtering device of claim 3, wherein the second combining circuit comprises:
   an interconnection node, arranged to receive the amplified pre-filtering signal, wherein the amplified output signal and the estimated noise signal are drained from the interconnection node.

6. The filtering device of claim 1, wherein the input signal, the pre-filtering signal and the output signal are voltage signals.

7. A filtering method, comprising:
   performing a low-pass filtering (LPF) operation upon a pre-filtering signal to generate an output signal;
   estimating an estimated noise signal according to the output signal and the pre-filtering signal; and
   subtracting the estimated noise signal from an input signal to generate the pre-filtering signal;
   wherein estimating the estimated noise signal according to the output signal and the pre-filtering signal comprises:
      amplifying the output signal by a first gain to generate an amplified output signal;
      amplifying the pre-filtering signal by a second gain to generate an amplified pre-filtering signal; and
      subtracting the amplified output signal from the amplified pre-filtering signal to generate the estimated noise signal.

8. The filtering method of claim 7, wherein the second gain minus the first gain is greater than minus one.

9. The filtering method of claim 7, wherein the input signal, the pre-filtering signal and the output signal are current signals.

* * * * *